United States Patent
Guo et al.

(10) Patent No.: US 9,106,134 B2
(45) Date of Patent: Aug. 11, 2015

(54) POWER TRANSFER DEVICES

(71) Applicant: O2 Micro Inc., Santa Clara, CA (US)

(72) Inventors: Guoyong Guo, San Jose, CA (US); Laszlo Lipcsei, Campbell, CA (US)

(73) Assignee: O2Micro, Inc., Santa Clara, CA (US)

( * ) Notice: Subject to any disclaimer, the term of this patent is extended or adjusted under 35 U.S.C. 154(b) by 252 days.

(21) Appl. No.: 13/924,018

(22) Filed: Jun. 21, 2013

(65) Prior Publication Data

US 2014/0375284 A1    Dec. 25, 2014

(51) Int. Cl.
*H02M 3/156* (2006.01)
*H02M 3/158* (2006.01)

(52) U.S. Cl.
CPC ..................... *H02M 3/158* (2013.01)

(58) Field of Classification Search
USPC ........................ 323/271, 282, 285, 299, 351
See application file for complete search history.

(56) References Cited

U.S. PATENT DOCUMENTS

| | | | |
|---|---|---|---|
| 4,873,480 A * | 10/1989 | Lafferty | 323/299 |
| 4,967,138 A * | 10/1990 | Obergfell et al. | 323/224 |
| 6,815,938 B2 * | 11/2004 | Horimoto | 323/282 |
| 7,760,522 B2 * | 7/2010 | Nobiki et al. | 363/25 |
| 7,764,053 B2 * | 7/2010 | Mehas et al. | 323/222 |
| 2005/0122089 A1 * | 6/2005 | Saitoh | 323/282 |
| 2005/0194951 A1 * | 9/2005 | Mehas et al. | 323/282 |
| 2006/0145678 A1 * | 7/2006 | Ribeiro et al. | 323/299 |
| 2007/0210774 A1 * | 9/2007 | Kimura et al. | 323/282 |
| 2011/0127978 A1 * | 6/2011 | Lee et al. | 323/282 |
| 2011/0260705 A1 * | 10/2011 | Saeki et al. | 323/299 |
| 2011/0279101 A1 * | 11/2011 | Sasaki et al. | 323/271 |
| 2012/0049829 A1 * | 3/2012 | Murakami | 323/288 |
| 2012/0126772 A1 * | 5/2012 | Yamakoshi et al. | 323/284 |
| 2013/0127429 A1 * | 5/2013 | Li | 323/282 |
| 2013/0141059 A1 * | 6/2013 | Parkhurst et al. | 323/271 |
| 2013/0176008 A1 * | 7/2013 | Li et al. | 323/273 |
| 2014/0159688 A1 * | 6/2014 | Peker | 323/282 |
| 2014/0218000 A1 * | 8/2014 | Su et al. | 323/282 |
| 2014/0375284 A1 * | 12/2014 | Guo et al. | 323/266 |

* cited by examiner

*Primary Examiner* — Jeffrey Sterrett

(57) ABSTRACT

A power transfer device includes an input terminal, an output terminal, a control unit, and a drive unit. The input terminal can receive an input voltage. The output terminal can provide an output voltage. The control unit can control a switch between the input and output terminals to adjust the output voltage according to the input voltage and a reference voltage, wherein said control unit is deactivated if the reference voltage reaches the input voltage. The drive unit can connect the control unit and the switch if the control unit is activated, and can maintain the output voltage at or near the input voltage if the control unit is deactivated.

20 Claims, 6 Drawing Sheets

POWER TRANSFER DEVICES

BACKGROUND

FIG. 1 shows a schematic diagram of a conventional power transfer device 100. The power transfer device 100 includes a power transfer switch Q1 (or a load switch), an activating unit 102, and a switch control unit 104. The power transfer switch Q1 includes an input terminal VA and an output terminal VA_S. The power transfer switch Q1 controls a connection between a power source (not shown) coupled to the input terminal VA and a load (not shown) coupled to the output terminal VA_S, and transfers power from the power source to the load. The activating unit 102 and the switch control unit 104 control a state of the power transfer switch Q1. To be specific, if an activating signal AS generated by the activating unit 102 is at logic high, then the switch Q2 is on and the switch Q3 is off, and therefore the power supply VCC charges the capacitor C1 to increase a gate voltage of the power transfer switch Q1 to gradually turn on the power transfer switch Q1. This process can be referred to as a "start-up process." When the power transfer switch Q1 is fully turned on (e.g., the voltages at the terminals VA and VA_S are substantially the same), the start-up process ends. If the activating signal AS generated by the activating unit 102 is at logic low, then the switch Q2 is off and the switch Q3 is on, and therefore the capacitor C1 discharges to ground to decrease the gate voltage of the power transfer switch Q1 to turn off the power transfer switch Q1.

The power transfer device 100 may be problematic. By way of example, on one hand, in order to maintain the load to receive power through the power transfer switch Q1, the current path of the series-coupled resistor R2 and switch Q2 needs to remain on to allow a current to pass through. On the other hand, in order to maintain the load disconnected from the power source, the current path of the series-coupled resistor R3 and switch Q3 needs to remain on to allow a current to pass through. This may lead to relatively high power consumption by the power transfer device 100.

Furthermore, the time it takes for the voltage at the output terminal VA_S to increase from a ground voltage to the voltage at the input terminal VA can be referred to as "start-up time." Different load devices may require different start-up times. For example, a load device may require a shorter start-up time to start up quickly, while another load device may require a longer start-up time to start up slowly. As another example, a load device may need its supply voltage (e.g., the voltage at the output terminal VA_S) to be controllable (e.g., to increase steadily) during the start-up process. However, once the power transfer device 100 is designed and built, it may not be able to satisfy all of these different requirements and so it may not be used with some types of load devices.

SUMMARY

In one embodiment, a power transfer device includes an input terminal, an output terminal, a control unit, and a drive unit. The input terminal is configured to receive an input voltage. The output terminal is configured to provide an output voltage. The control unit is coupled to the output terminal, and is configured to control a first switch that is coupled between the input and output terminals to adjust the output voltage according to the input voltage and a reference voltage. The control unit is deactivated if a level of the reference voltage reaches a level of the input voltage. The drive unit is coupled to the control unit, and is configured to provide a connection between the control unit and the first switch if the control unit is activated, and configured to maintain a level of the output voltage at or near the level of the input voltage if the control unit is deactivated.

BRIEF DESCRIPTION OF THE DRAWINGS

Features and advantages of embodiments of the claimed subject matter will become apparent as the following detailed description proceeds, and upon reference to the drawings, wherein like numerals depict like parts, and in which:

DETAILED DESCRIPTION

Figure 1:
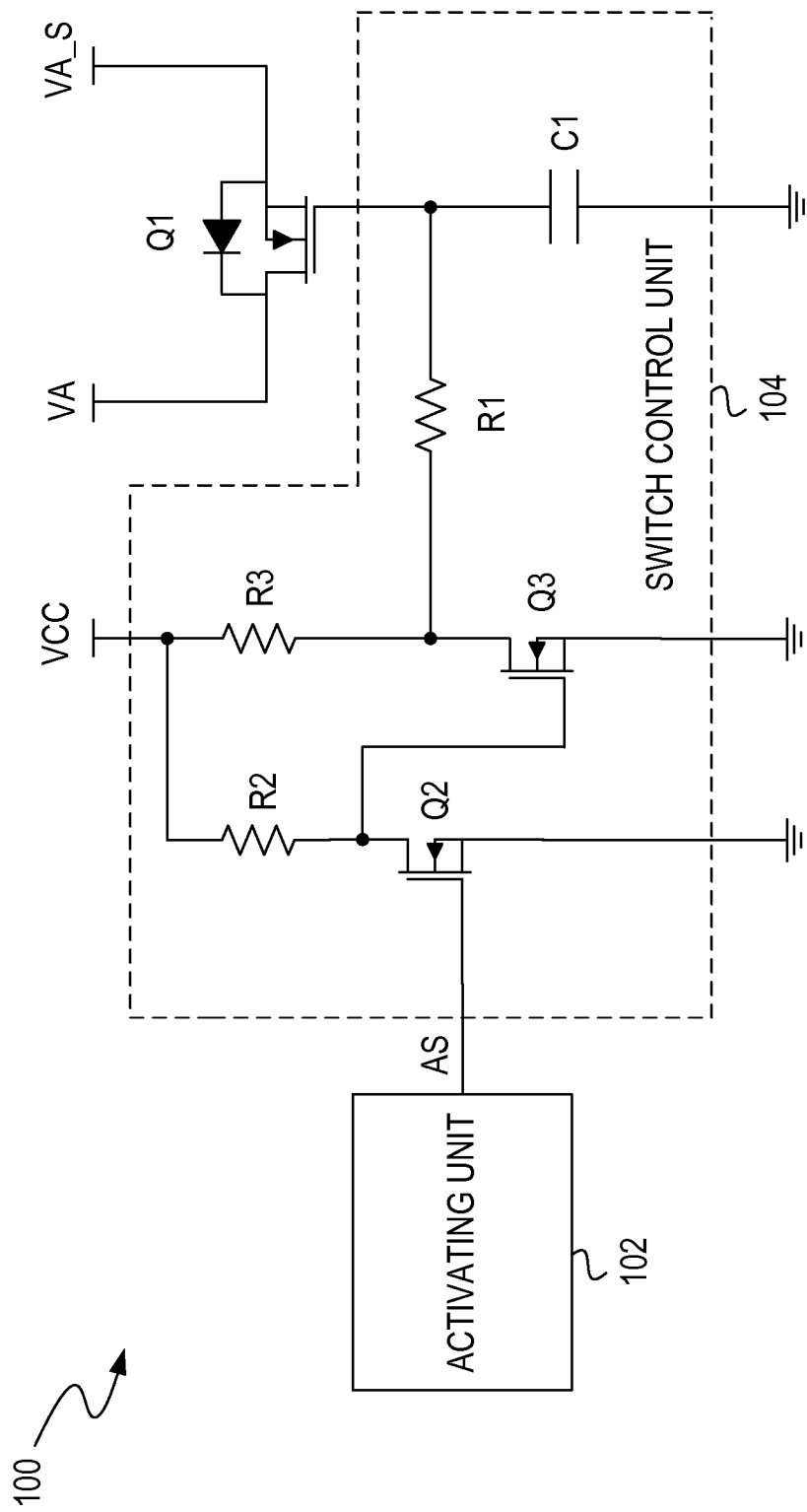
FIG. 1 shows a schematic diagram of a conventional power transfer device.

Reference will now be made in detail to the embodiments of the present invention. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

In one embodiment, a power transfer device generates an output voltage at an output terminal based on an input voltage at an input terminal to transfer power from the input terminal to the output terminal. The power transfer device can control a state of a charge switch to control the power transfer. By way of example, the power transfer device can operate in a charge mode and a transfer mode. In the charge mode, the power transfer device can activate a control unit to turn on the charge switch in order to increase the output voltage, e.g., linearly over time. When the level of the output voltage increases to the level of the input voltage, the power transfer device enters the transfer mode. In the transfer mode, the power transfer device disables the control unit, and keeps the charge switch turned on using a method that consumes lower power. In another embodiment, the power transfer device can transition from the transfer mode to a discharge mode, and the power transfer device can control a state of a discharge switch in the discharge mode to vary the output voltage at the output terminal. By way of example, in the discharge mode, the charge switch is turned off, and the control unit is reactivated to turn on the discharge switch in order to decrease the output voltage, e.g., linearly over time. When the output voltage is decreased to the ground voltage, the power transfer device disables the control unit, and turns off the discharge switch and maintains the charge switch off using a low power consumption method.

In one embodiment, the power transfer device controls a connection between a power source and a load. Advantageously, the control unit is deactivated when the load is maintained in order to receive power from the power source, and is also deactivated when the load is maintained in order to be disconnected from the power source. Thus, the power consumption of the power transfer device is reduced. Additionally, in one embodiment, the output voltage of the power transfer device can be controlled to increase/decrease smoothly, e.g., linearly over time, to avoid damaging load devices powered by the output voltage. The variation rate of the output voltage is also controllable, and therefore the power transfer device is applicable to load devices having different requirements.

Figure 2:
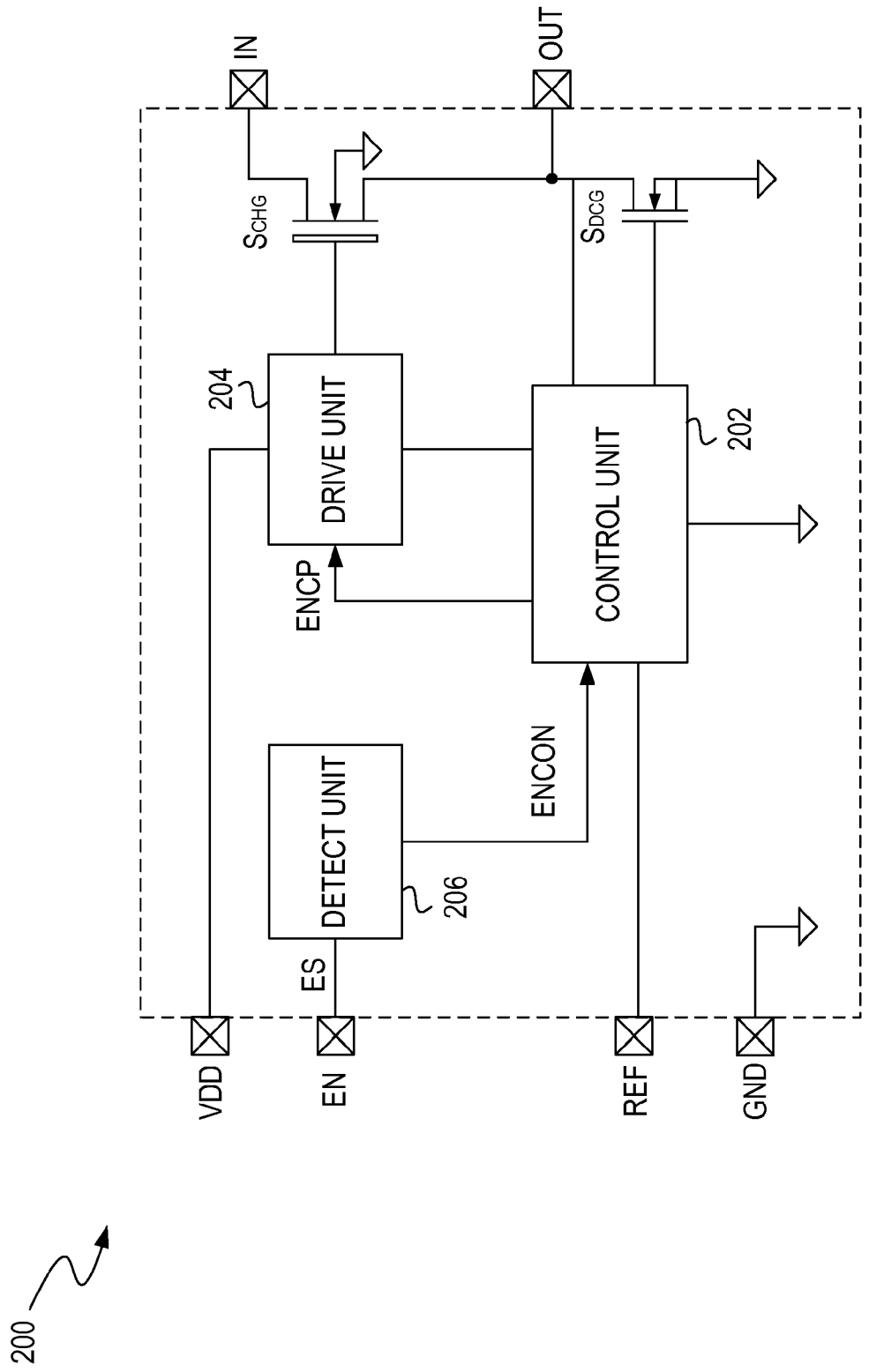
FIG. 2 illustrates an example of a block diagram of a power transfer device, in an embodiment according to the present invention.

FIG. 2 illustrates an example of a block diagram of a power transfer device 200, in an embodiment according to the present invention. The power transfer device 200 includes a control unit 202, a drive unit 204, a detect unit 206, a first switch $S_{CHG}$, and a second switch $S_{DCG}$. The power transfer device 200 can be integrated into one chip and may include an input terminal IN, an output terminal OUT, a voltage source terminal VDD, an enable terminal EN, a reference terminal REF, and a ground terminal GND. The control unit 202 is coupled to the output terminal OUT to control an output voltage at the terminal OUT. The drive unit 204 is coupled to the control unit 202 and the first switch $S_{CHG}$ to provide a connection between the control unit 202 and the first switch $S_{CHG}$ if the control unit 202 is activated. The first switch $S_{CHG}$, e.g., a charge switch $S_{CHG}$, is coupled to the input terminal IN to receive an input voltage of the power transfer device 200, and is coupled to the output terminal OUT to provide an output voltage for a load (not shown) based on the input voltage and a reference voltage provided at the reference terminal REF. The second switch $S_{DCG}$, e.g., a discharge switch $S_{DCG}$, is coupled to the control unit 202 and the output terminal OUT. The units 202, 204, and 206 can control states of the charge and discharge switches $S_{CHG}$ and $S_{DCG}$, in order to control the power transfer from the input terminal IN to the output terminal OUT. In one embodiment, the charge switch $S_{CHG}$ is a metal-oxide-semiconductor field-effect transistor (MOSFET), e.g., N-type MOSFET or P-type MOSFET. In the example of FIG. 2, the charge switch $S_{CHG}$ is embodied as an N-type MOSFET; however, this is not intended to be a limitation, and the charge switch $S_{CHG}$ of the present invention can be embodied as another type of switching element. Similarly, in the example of FIG. 2, the discharge switch $S_{DCG}$ is embodied as an N-type MOSFET; however, this is not intended to be a limitation, and the discharge switch $S_{DCG}$ of the present invention can be embodied as another type of switching element.

In one embodiment, the power transfer device 200 can work in a mode selected from a charge mode, a discharge mode, and a transfer mode. Referring to FIG. 2, the detect unit 206 is coupled to the enable terminal EN to receive and detect a device enable signal ES. The detect unit 206 may activate the control unit 202 according to the enable signal ES. By way of example, when the detect unit 206 receives an enable signal ES, e.g., at logic high, the detect unit 206 provides a control unit enable signal ENCON, e.g., with a rising edge, to activate the control unit 202. According to the rising edge of the enable signal ENCON, the control unit 202 provides a drive unit enable signal ENCP to activate the drive unit 204, and the power transfer device 200 enters a charge mode. The charge mode can last for a controllable start-up time. A definition of the start-up time is given in the description for FIG. 3 below. In the charge mode, the drive unit 204 can drive the control unit 202 to control the charge switch $S_{CHG}$ in a first state, e.g., operating in a saturation (active) region, to increase the output voltage, e.g., linearly over time. In one embodiment, the enable signal ES can remain at, e.g., logic high, and when the charge mode is over, the power transfer device 200 enters a transfer mode. In the transfer mode, the control unit 202 is deactivated and the drive unit 204 maintains the charge switch $S_{CHG}$ in a second state, e.g., fully turned on, so that the level of the output voltage remains at or near the level of the input voltage. As used herein, "at or near" means that, when the charge switch $S_{CHG}$ operates in a linear region, e.g., is fully turned on, the level of the output voltage can be different from the level of the input voltage because of the non-zero on-resistance of the charge switch $S_{CHG}$, but the difference is within a range that is acceptable by design. In one embodiment, the transfer mode lasts as long as the enable signal ES is at, e.g., logic high. When the enable signal ES turns, e.g., from logic high to logic low, the detect unit 206 provides an enable signal ENCON, e.g., with a falling edge, to activate (or reactivate) the control unit 202, and the power transfer device 200 enters a discharge mode. In the discharge mode, the charge switch $S_{CHG}$ is turned off, and the discharge switch $S_{DCG}$ is turned on. Additionally, the control unit 202 can maintain the signal ENCP, e.g., at logic high, to maintain the drive unit 204 active, and the drive unit 204 can drive the control unit 202 to control the discharge switch $S_{DCG}$ to decrease the output voltage at the output terminal OUT, e.g., linearly. The discharge mode can last for a controllable shut-down time. A definition of the shut-down time is given in the description for FIG. 3 below. Further details regarding the above mentioned charge mode, transfer mode, and discharge mode are discussed in combination with FIG. 3.

Figure 3:
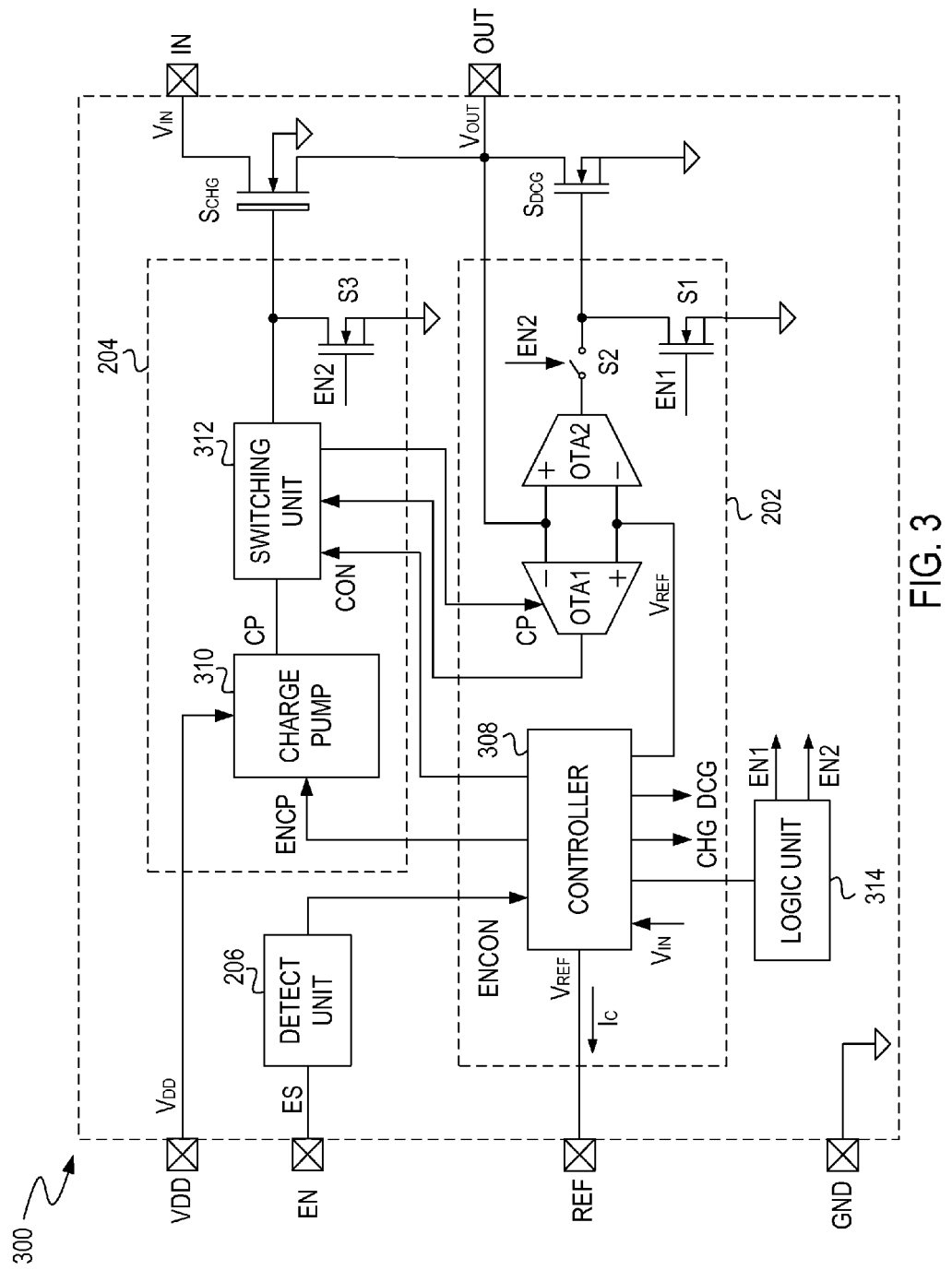
FIG. 3 illustrates an example of a schematic diagram of a power transfer device, in an embodiment according to the present invention.

FIG. 3 illustrates an example of a schematic diagram of a power transfer device 300, in an embodiment according to the present invention.

In the FIG. 3 embodiment, the control unit 202 includes a controller 308, a voltage follower (e.g., including amplifiers OTA1 and OTA2), and switches S1 and S2. In one embodiment, the controller 308 can be activated in response to an enable signal ENCON, e.g., with a rising edge, to operate in a charge mode, or in response to an enable signal ENCON, e.g., with a falling edge, to operate in a discharge mode. In the charge mode, the controller 308 can generate a charging current $I_C$ to charge a reference capacitor (not shown) coupled to the reference terminal REF, and a reference voltage $V_{REF}$ at the reference terminal REF increases. Meanwhile, the controller 308, e.g., including a comparator, can compare the reference voltage $V_{REF}$ with an input voltage $V_{IN}$ at the input terminal IN (or with a sensing signal indicative of the input voltage $V_{IN}$). Additionally, the controller 308 generates a control signal CON if the comparison result indicates that the reference voltage $V_{REF}$ has increased to the input voltage $V_{IN}$. In the discharge mode, the controller 308 can generate a discharging current $I_C$ to discharge the reference capacitor, and the reference voltage $V_{REF}$ decreases. Meanwhile, the controller 308 can compare the reference voltage $V_{REF}$ with a ground voltage, e.g., zero volts, and generate another control signal when the reference voltage $V_{REF}$ decreases to the ground voltage.

In one embodiment, the controller 308 can further include logic elements (not shown) for generating logic signals. By way of example, during the charge mode and during the discharge mode, the controller 308 keeps detecting the enable signal ENCON so as to generate signals CHG, DCG, and ENCP at logic high or logic low according to the enable signal ENCON. The signal CHG activates the amplifier OTA1 in the charge mode, the signal DCG activates the amplifier OTA2 in the discharge mode, and the drive unit 204 is maintained active by the signal ENCP in the charge, transfer, and discharge modes. Moreover, the power transfer device 300 can further include a logic unit 314 for generating logic signals EN1 and EN2 at logic high or logic low. The signal EN1 controls a state of the switch S1, and the signal EN2 controls a state of the switch S2. In the FIG. 3 embodiment, the logic unit 314 is coupled to and controlled by the controller 308 to generate the logic signals EN1 and EN2. However, this invention is not so limited, and in an alternative embodiment, the logic unit 314 can be included in the aforementioned logic elements of the controller 308. In that case, the controller 308 can further provide the logic signals EN1 and EN2 according to the enable signal ENCON, and during the transfer mode, the logic unit 314 keeps providing the logic signals EN1 and EN2 in response to the enable signal ENCON, while the other parts of the control unit 202 can be deactivated. In the following description, the logic unit 314 is embodied as a separate unit which is coupled to the control unit 202.

In one embodiment, the voltage follower is coupled between the controller 308 and the output terminal OUT, and includes differential amplifiers such as operational transconductance amplifiers OTA1 and OTA2. The amplifier OTA1 works during the charge mode in response to the signal CHG, and the amplifier OTA2 works during the discharge mode in response to the signal DCG. By way of example, in the charge mode, the amplifier OTA2 is disabled, and the amplifier OTA1 compares an output voltage $V_{OUT}$ at the output terminal OUT with the reference voltage $V_{REF}$ to adjust the level of the output voltage $V_{OUT}$ according to a difference between the reference voltage $V_{REF}$ and the output voltage $V_{OUT}$. In one embodiment, the output terminal OUT is coupled to a load via an output capacitor (not shown), and the output voltage $V_{OUT}$ can increase as a current through the charge switch $S_{CHG}$ charges the output capacitor. As mentioned above, during the charge mode, the controller 308 can increase the reference voltage $V_{REF}$. If the output voltage $V_{OUT}$ is less than the reference voltage $V_{REF}$, then the output of the amplifier OTA1 increases a gate voltage of the charge switch $S_{CHG}$ to accelerate the rate of increase of the output voltage $V_{OUT}$. If the output voltage $V_{OUT}$ is greater than the reference voltage $V_{REF}$, then the output of the amplifier OTA1 decreases the gate voltage of the charge switch $S_{CHG}$ to decelerate the rate of increase of the output voltage $V_{OUT}$. If the output voltage $V_{OUT}$ is approximately equal to the reference voltage $V_{REF}$, then the output of the amplifier OTA1 maintains the gate voltage of the charge switch $S_{CHG}$ to maintain the rate of increase of the output voltage $V_{OUT}$. As a result, the control unit 202 varies the reference voltage $V_{REF}$ and adjusts the output voltage $V_{OUT}$ according to the varying reference voltage $V_{REF}$. By way of example, during the charge mode, the controller 308 controls the reference voltage $V_{REF}$ to increase, e.g., linearly over time, and the voltage follower, e.g., the amplifier OTA1, increases the output voltage $V_{OUT}$ to follow the reference voltage $V_{REF}$.

Similarly, during the discharge mode in one embodiment, the amplifier OTA1 is disabled, and the amplifier OTA2 compares the output voltage $V_{OUT}$ with the reference voltage $V_{REF}$ to adjust the level of the output voltage $V_{OUT}$ according to a difference between the reference voltage $V_{REF}$ and the output voltage $V_{OUT}$. In one embodiment, the output voltage $V_{OUT}$ can decrease as a current through the discharge switch $S_{DCG}$ discharges the output capacitor. As mentioned above, during the discharge mode, the controller 308 can decrease the reference voltage $V_{REF}$. If the output voltage $V_{OUT}$ is greater than the reference voltage $V_{REF}$, then the output of the amplifier OTA2 increases a gate voltage of the discharge switch $S_{DCG}$ to accelerate the rate of decrease of the output voltage $V_{OUT}$. If the output voltage $V_{OUT}$ is less than the reference voltage $V_{REF}$, then the output of the amplifier OTA2 decreases the gate voltage of the discharge switch $S_{DCG}$ to decelerate the rate of decrease of the output voltage $V_{OUT}$. If the output voltage $V_{OUT}$ is approximately equal to the reference voltage $V_{REF}$, then the output of the amplifier OTA2 maintains the gate voltage of the discharge switch $S_{DCG}$ to maintain the rate of decrease of the output voltage $V_{OUT}$. As a result, in the discharge mode, the control unit 202 decreases the reference voltage $V_{REF}$ and decreases the output voltage $V_{OUT}$ to follow the decreasing reference voltage $V_{REF}$.

In one embodiment, the drive unit 204 includes a charge pump 310, a switching unit 312, and a switch S3. A state of the switch S3 is controlled by the signal EN2. The charge pump 310 can be activated in response to the signal ENCP provided from the controller 308. When the charge pump 310 is activated, the charge pump 310 can provide a driving signal CP to drive the amplifiers OTA1 and OTA2 in the charge mode and discharge mode, respectively, and to drive the charge switch $S_{CHG}$ in the transfer mode. The charge pump 310 converts an input voltage, e.g., a voltage $V_{DD}$ at the voltage source terminal VDD, to an output voltage CP which is greater than the voltage $V_{DD}$. The switch unit 312 can include switches that control the signal flow of the driving signal CP and the output of the amplifier OTA1. By way of example, the switching unit 312 can provide the output of the amplifier OTA1 to control the charge switch $S_{CHG}$ during the charge mode, and provide an output of the charge pump 310, e.g., the driving signal CP, to control the charge switch $S_{CHG}$ during the transfer mode. To be specific, the switching unit 312 may receive a control signal CON generated by the controller 308 to disconnect the amplifier OTA1 from the charge switch $S_{CHG}$ and to connect the charge pump 310 with the charge switch $S_{CHG}$. More details regarding the processes in the charge mode, transfer mode, and discharge mode are illustrated below.

In operation, in one embodiment, when the power transfer device 300 receives an enable signal ES, e.g., at logic high, the controller 308 is activated by an enable signal ENCON from the detect unit 206, and the charge pump 310 is activated by a signal ENCP from the control unit 202. The power transfer device 300 enters the charge mode.

During the charge mode, the controller 308 enables the amplifier OTA1, and the switching unit 312 delivers the driving signal CP to drive the amplifier OTA1. The switching unit 312 also connects the control unit 202 with the charge switch $S_{CHG}$, such that an output of the amplifier OTA1 is provided to control the charge switch $S_{CHG}$ into a first state, e.g., the saturation region. The switch S3 is turned off by a signal EN2 from the controller 308. In addition, the controller 308 controls the reference voltage $V_{REF}$ at the reference terminal REF to increase, e.g., linearly. The amplifier OTA1 coupled between the controller 308 and the output terminal OUT varies the output voltage $V_{OUT}$ at the output terminal OUT as the reference voltage $V_{REF}$ at the reference terminal REF varies. In other words, the amplifier OTA1 controls the output voltage $V_{OUT}$ to follow the reference voltage $V_{REF}$. Thus, the output voltage $V_{OUT}$ increases, e.g., linearly, during the charge mode. Moreover, the controller 308 compares the reference voltage $V_{REF}$ at the reference terminal REF with the input voltage $V_{IN}$ received at the input terminal IN. When the reference voltage $V_{REF}$ increases to the input voltage $V_{IN}$, e.g., indicating that the output voltage $V_{OUT}$ has increased to the input voltage $V_{IN}$ and the charge switch $S_{CHG}$ may already have entered the linear (ohmic) region, the controller 308 generates the control signal CON to the switching unit 312 such that the amplifier OTA1 is disconnected from the charge switch $S_{CHG}$ and the driving signal CP of the charge pump 310 is provided to maintain the charge switch $S_{CHG}$ operating in the linear region, e.g., fully turned on. The power transfer device 300 then enters the transfer mode.

During the transfer mode, the switching unit 312 delivers the driving signal CP from the charge pump 310 to maintain the charge switch $S_{CHG}$ fully turned on, and to maintain the level of the output voltage $V_{OUT}$ at or near the level of the input voltage $V_{IN}$. In addition, the aforementioned control signal CON causes the control unit 202, including the circuitry 308, OTA1, and OTA2, to be deactivated so as to save power. The detect unit 206 keeps detecting the enable signal ES. If the enable signal ES turns to, e.g., logic low, the detect unit 206 can generate an enable signal ENCON, e.g., with a falling edge, to the controller 308, and by detecting the falling edge of the enable signal ENCON, the controller 308 generates a signal DCG to enable the amplifier OTA2. Additionally, the logic unit 314 can generate a signal EN2 to turn on the switch S3 so as to turn off the charge switch $S_{CHG}$, a signal EN1 to turn off the switch S1, and a signal EN2 to turn on the switch S2 to connect the output of the amplifier OTA2 to the discharge switch $S_{DCG}$. The power transfer device 300 then enters the discharge mode.

During the discharge mode, the controller 308 is reactivated to control the reference voltage $V_{REF}$ to decrease, e.g., linearly. The output of the amplifier OTA2 can control the output voltage $V_{OUT}$ at the output terminal OUT to follow the reference voltage $V_{REF}$ at the reference terminal REF. As a result, the output voltage $V_{OUT}$ decreases, e.g., linearly, during the discharge mode. Moreover, the controller 308 compares the reference voltage $V_{REF}$ with the ground voltage. When the reference voltage $V_{REF}$ decreases to the ground voltage, e.g., indicating that the output voltage $V_{OUT}$ has decreased to the ground voltage, the controller 308 generates a control signal. In response to the control signal, the amplifier OTA2 is disabled, and the power transfer device 300 enters an inactive mode (or a sleep mode).

During the inactive mode, the detect unit 206 keeps detecting the enable signal ES, and the logic unit 314 provides a signal EN1 to turn on the switch S1 so as to turn off the discharge switch $S_{DCG}$, and a signal EN2 to turn on the switch S3 so as to turn off the charge switch $S_{CHG}$. In one embodiment, in the inactive mode, the control unit 202 and the drive unit 204 are inactive. The inactive mode can last until an enable signal ES, e.g., at logic high, is detected again.

Advantageously, in one embodiment, during the transfer mode, the control unit 202, including the circuitry 308, OTA1, and OTA2, is deactivated/disabled. The charge pump 310 can mainly include switching elements and energy storage elements such as capacitors, and therefore consumes relatively small power. The charge pump 310 can work at a relatively low frequency (e.g., a predetermined frequency) to further reduce the power consumption. Additionally, the detect unit 206 can mainly include logic elements, e.g., logic gates, and so the power consumption of the detect unit 206 can be rather low. Thus, the power consumption of the power transfer device 300 during the transfer mode can be relatively low. Moreover, when the power transfer device 300 is in the inactive mode, except the detect unit 206 and the logic unit 314 are active, the other circuits in the power transfer device 300 can be inactive. Thus, the power consumption of the power transfer device 300 during the inactive mode can also be relatively low. Consequently, the power transfer device 300 can consume less power compared with the conventional power transfer device 100 (FIG. 1).

As described above, the charge mode can last for a controllable start-up time, and the discharge mode can last for a controllable shut-down time. In one embodiment, the start-up time is designed to protect the loads from being damaged by a large instantaneous charging current flowing from the power transfer device 300 (FIG. 3). During the start-up time period, the charge switch $S_{CHG}$ is turned on gradually, and the reference voltage $V_{REF}$ can increase linearly from the ground voltage to the input voltage $V_{IN}$. Moreover, the charge switch $S_{CHG}$ is fully-turned on at the end of the start-up time period. In one embodiment, the shut-down time is also designed to prevent damages brought by a large instantaneous discharging current from the power transfer device 300. During the shut-down time period, the charge switch $S_{CHG}$ is turned off and the discharge switch $S_{DCG}$ is turned on, and the reference voltage $V_{REF}$ can decrease linearly from the input voltage $V_{IN}$ to the ground voltage. Advantageously, the start-up time and the shut-down time are controllable to satisfy the requirements of different types of load devices. By way of example, during the charge mode, the controller 308 can generate a constant charging current $I_C$ to charge the aforementioned reference capacitor coupled to the reference terminal REF such that the reference voltage $V_{REF}$, as well as the output voltage $V_{OUT}$, increase linearly; and during the discharge mode, the controller 308 can generate a constant discharging current $I_C$ to discharge the reference capacitor such that the reference voltage $V_{REF}$, as well as the output voltage $V_{OUT}$, decrease linearly. By adjusting the capacitance value of the reference capacitor, the variation rate (e.g., an increasing slope or a decreasing slope) of the reference voltage $V_{REF}$ can be controlled. For example, by increasing the capacitance value of the reference capacitor, the variation rate of the reference voltage $V_{REF}$ is decreased, and the start-up and shut-down time can be prolonged; and by decreasing the capacitance value of the reference capacitor, the variation rate of the reference voltage $V_{REF}$ is increased, and the start-up and shut-down time can be shortened. Although constant charging and discharging currents $I_C$ are disclosed herein, the invention is not so limited. In another embodiment, the controller 308 can generate controllable but not constant charging current and discharging current to control the charging and discharging of the reference capacitor, and the start-up and shut-down time can also be controlled by adjusting the capacitance of the reference capacitor.

Figure 4:
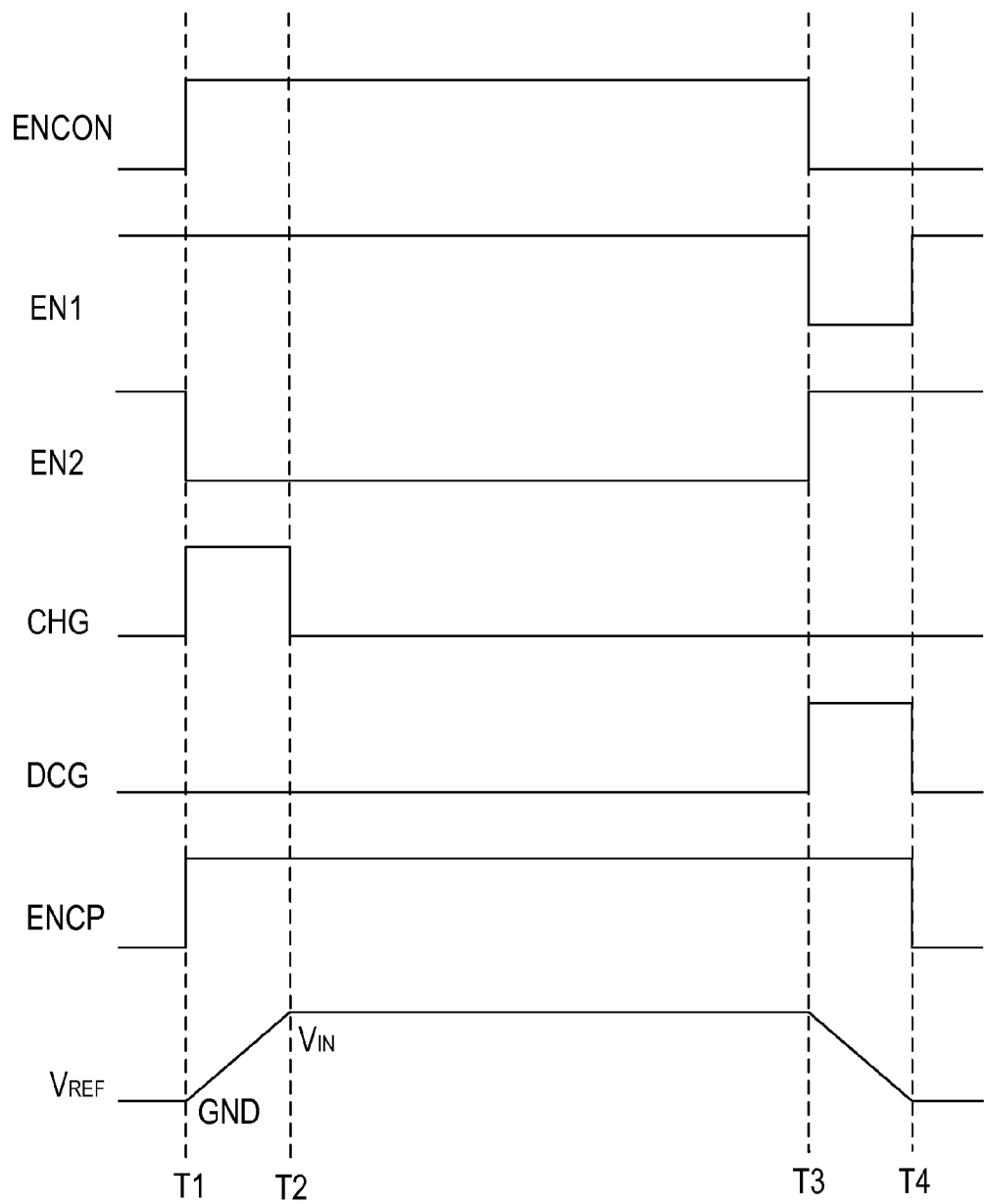
FIG. 4 illustrates examples of waveforms of signals associated with a control unit, in an embodiment according to the present invention.

FIG. 4 illustrates examples of waveforms of signals ENCON, EN1, EN2, CHG, DCG, ENCP, and $V_{REF}$ associated with the control unit 202, in an embodiment according to the present invention. FIG. 4 is described in combination with FIG. 3.

At the time T1, the control unit 202 (e.g., the controller 308) detects a rising edge of the enable signal ENCON, and thus the power transfer device 300 enters the charge mode. During the charge mode, the controller 308 generates signals ENCP and EN1 at logic high, and controls a signal EN2 at logic low. The controller 308 further generates a charge enable signal CHG at logic high for a period of time, e.g., the start-up time mentioned above. During that period of time, the charge enable signal CHG is provided to enable the amplifier OTA1 to control the state of the charge switch $S_{CHG}$. As shown in FIG. 4, the start-up time is given as (T2−T1). During the start-up time period, the charge switch $S_{CHG}$ is turned on gradually by the output of the amplifier OTA1, the reference voltage $V_{REF}$ increases, e.g., linearly, from the ground voltage to the input voltage $V_{IN}$, and the output voltage $V_{OUT}$ at the output terminal OUT is controlled to follow the reference voltage $V_{REF}$ so as to increase, e.g., linearly, from the ground voltage to the input voltage $V_{IN}$. At the time T2, the charge switch $S_{CHG}$ may be already fully turned on, and the reference voltage $V_{REF}$ reaches the input voltage $V_{IN}$, indicating the output voltage $V_{OUT}$ has essentially reached the input voltage $V_{IN}$, and thus the controller 308 generates a control signal CON according to the comparison result. The power transfer device 300 enters the transfer mode at the time T2.

During the time T2 to T3, the enable signal ENCON is maintained at logic high, and the power transfer device 300 works in the transfer mode. During the transfer mode, the control unit 202 is deactivated as a result of the control signal CON. The charge pump 310 included in the drive unit 204 can work at a relatively low frequency to maintain the charge switch $S_{CHG}$ fully-turned on. In addition, the level of the output voltage $V_{OUT}$ is maintained at or near the level of the input voltage $V_{IN}$ by the charge pump 310 during the transfer mode. At the time T3, the enable signal ES turns to, e.g., logic low, and the power transfer device 300 enters the discharge mode.

At the time T3, the control unit 202 (e.g., the controller 308) detects a falling edge of the enable signal ENCON, and the power transfer device 300 works in the discharge mode from the time T3 to the time T4 as shown in FIG. 4. During the discharge mode, the controller 308 generates signals ENCP at logic high, and the logic unit 314 generates a signal EN2 at logic high and a signal EN1 at logic low. The controller 308 further generates a discharge enable signal DCG at logic high for a period of time, e.g., an abovementioned shut-down time, to enable the amplifier OTA2. As shown, the shut-down time is given as (T4−T3). During the period of the shut-down time, the charge switch $S_{CHG}$ is turned off and the discharge switch $S_{CHG}$ is turned on. The reference voltage $V_{REF}$ decreases, e.g., linearly, from the input voltage $V_{IN}$ to the ground voltage, and the output voltage $V_{OUT}$ is controlled to follow the reference voltage $V_{REF}$ so as to decrease, e.g., linearly, from the input voltage $V_{IN}$ to the ground voltage. At the time T4, the reference voltage $V_{REF}$ decreases to the ground voltage, indicating that the output voltage $V_{OUT}$ substantially decreases to the ground voltage, and the controller 308 generates a control signal CON. As a result of the control signal CON, the power transfer device 300 enters an inactive mode (or a sleep mode) at the time T4.

From the time T4, the power transfer device 300 works in the inactive mode until, e.g., another rising edge of, the enable signal ENCON is detected by the control unit 202 (e.g., the controller 308). During the inactive mode, the logic unit 314 generates enable signals EN1 and EN2 at logic high to maintain the charge switch $S_{CHG}$ and the discharge switch $S_{DCG}$ off. In one embodiment, in the inactive mode, the control unit 202 and the drive unit 204 are inactive.

Figure 5:
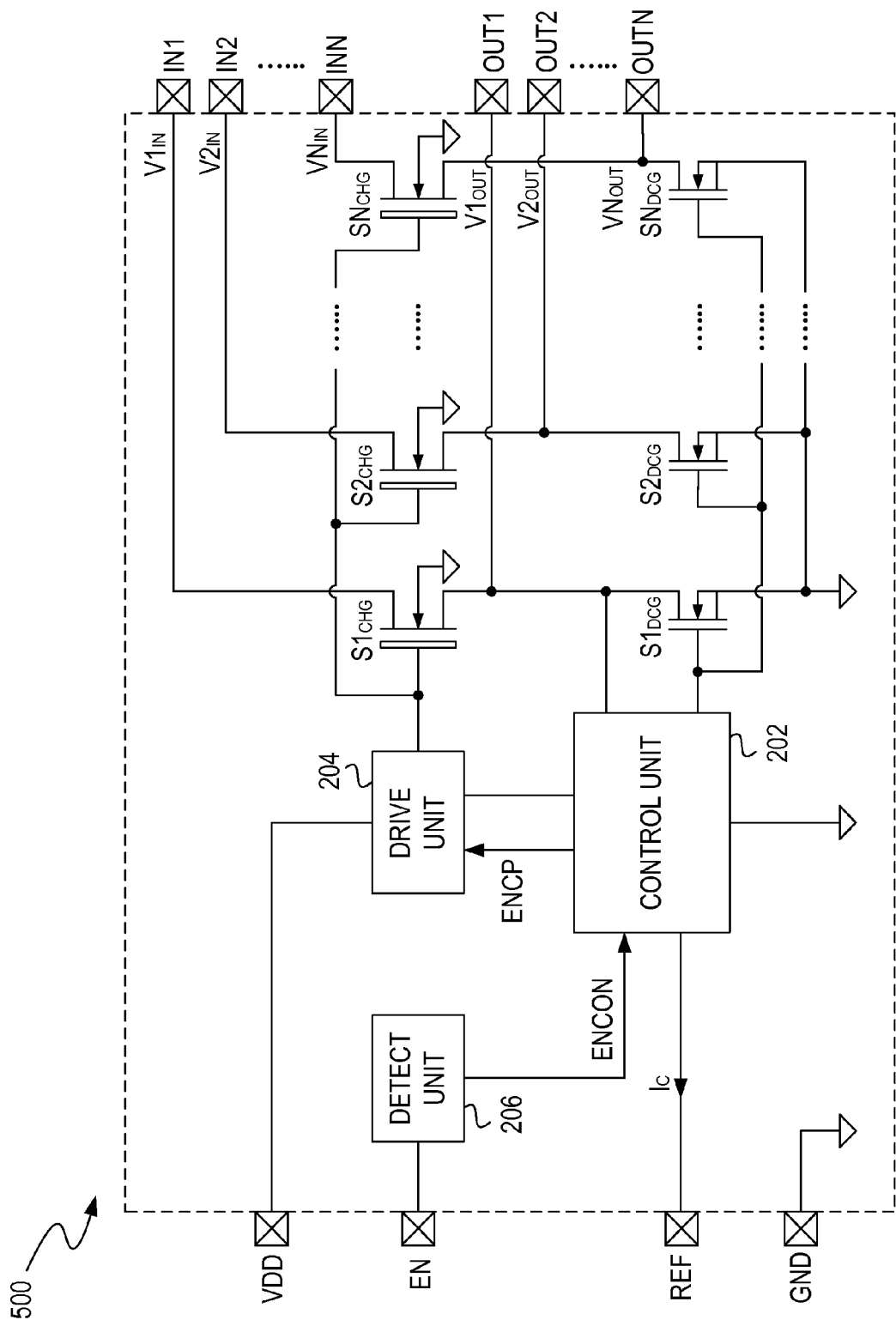
FIG. 5 illustrates an example of a schematic diagram of a power transfer device, in an embodiment according to the present invention.

FIG. 5 illustrates an example of a schematic diagram of a power transfer device 500, in an embodiment according to the present invention. FIG. 5 is described in combination with FIG. 3.

The structure of the power transfer device 500 is similar to the structure of the power transfer device 300, except that the power transfer device 500 includes a set of charge switches (e.g., $S1_{CHG}, S2_{CHG}, \ldots,$ and $SN_{CHG}$) and a set of discharge switches (e.g., $S1_{DCG}, S2_{DCG}, \ldots,$ and $SN_{DCG}$). Moreover, the power transfer device 500 can include a set of input terminals (e.g., IN1, IN2, ..., and INN), respectively coupled to the charge switches $S1_{CHG}$-$SN_{CHG}$, to receive input voltages (e.g., $V1_{IN}, V2_{IN}, \ldots,$ and $VN_{IN}$) indicative of input power, and can include a set of output terminals (e.g., OUT1, OUT2, ..., and OUTN) respectively coupled to the charge switches $S1_{CHG}$-$SN_{CHG}$ and the discharge switches $S1_{DCG}$-$SN_{DCG}$, in a manner as shown in FIG. 5, to provide output voltages (e.g., $V1_{OUT}, V2_{OUT}, \ldots,$ and $VN_{OUT}$) for powering load(s) (not shown). In one embodiment, the input terminals IN1-INN can receive the input voltages from a single power source or multiple power sources, and the output terminals OUT1-OUTN can provide the output voltages to power a single load device or multiple load devices. By way of example, the input voltages $V1_{IN}$-$VN_{IN}$ can be provided from the same power source (not shown), and the output voltages $V1_{OUT}$-$VN_{OUT}$ can be provided to the same load device (not shown). In that case, the charge switches $S1_{CHG}$-$SN_{CHG}$ are coupled in parallel between the same power source and the same load device, and thus the internal resistance value, referred to as "on-resistance," of the parallel-coupled charge switches $S1_{CHG}$-$SN_{CHG}$ is reduced to decrease the voltage drop on the charge switches $S1_{CHG}$-$SN_{CHG}$. Also, the discharge switches $S1_{DCG}$-$SN_{DCG}$ are coupled in parallel between the ground and the same load device, and the voltage drop on the discharge switches $S1_{DCG}$-$SN_{DCG}$ can be reduced. As a result, the on-resistance of the power transfer device 500 is controllable, and the power consumption of the power transfer device 500 can be reduced. By way of another example, the input voltages $V1_{IN}$-$VN_{IN}$ can be provided from different power sources (not shown), and the output voltages $V1_{OUT}$-$VN_{OUT}$ can be provided to different load devices (not shown).

In the example of FIG. 5, the control unit 202 senses the output voltage $V_{OUT}$ at the output terminal OUT1, and controls the charge switches $S1_{CHG}$-$SN_{CHG}$ and the discharge switches $S1_{DCG}$-$SN_{DCG}$ according to the output voltage $V1_{OUT}$. Thus, in the charge mode, the control unit 202 can control the output voltage $V_{OUT}$ to follow an increasing reference voltage $V_{REF}$ at the reference terminal REF, controls the output voltages $V2_{OUT}$-$VN_{OUT}$ in accordance with the controlling of the output voltage $V1_{OUT}$, and controls the power transfer device 500 to enter the transfer mode when the reference voltage $V_{REF}$ increases to the input voltage $V1_{IN}$ at the input terminal IN1. In this example, if the input terminals IN1-INN receive different input voltages, then the input terminal IN1 can be configured to receive the maximum input voltage among the input voltages, such that the charge switches $S2_{CHG}$-$SN_{CHG}$ can be fully turned on when the charge switch is $S1_{CHG}$ is fully turned on. In other words, when the output voltage $V1_{OUT}$ increases to the input voltage $V1_{IN}$, the other output voltages $V2_{OUT}$-$VN_{OUT}$ also increase to their corresponding input voltages $V2_{IN}$-$VN_{IN}$. However, the invention is not so limited. In another embodiment, the control unit 202 can sense an output voltage $VK_{OUT}$ (K=2, 3, ..., N) at an output terminal OUTK (K=2, 3, ..., N), and can control the switches $S1_{CHG}$-$SN_{CHG}$ and $S1_{DCG}$-$SN_{DCG}$ according to the output voltage $VK_{OUT}$. In one such embodiment, the input terminal INK (K=2, 3, ..., N) can be configured to receive the maximum of the input voltages.

Figure 6:
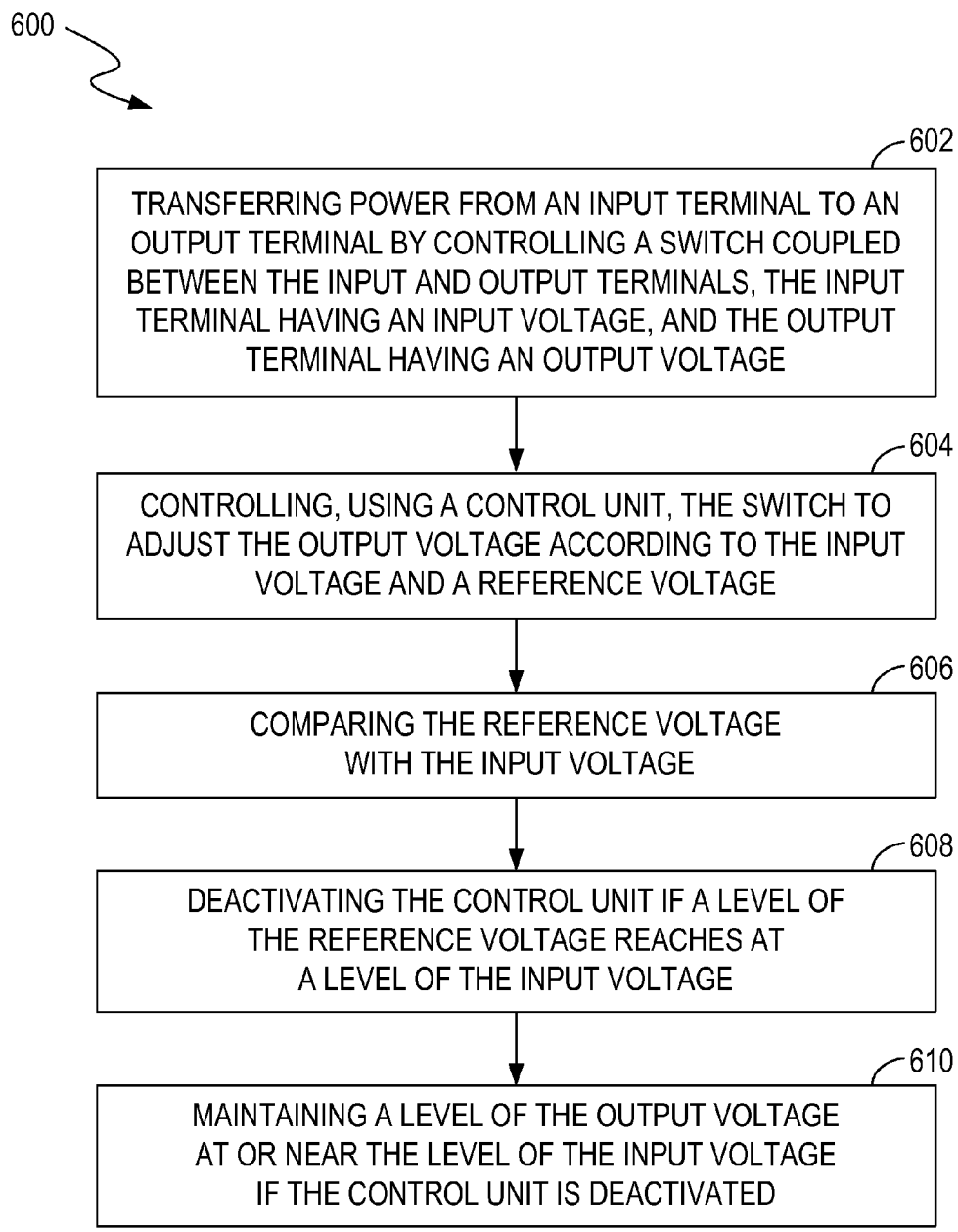
FIG. 6 illustrates a flowchart of examples of operations performed by a power transfer device, in an embodiment according to the present invention.

FIG. 6 illustrates a flowchart 600 of examples of operations performed by the power transfer devices 200, 300 or 500, in an embodiment according to the present invention. Although specific steps are disclosed in FIG. 6, such steps are examples. That is, the present invention is well suited to performing various other steps or variations of the steps recited in FIG. 6. FIG. 6 is described in combination with FIG. 2, FIG. 3, FIG. 4 and FIG. 5.

In step 602, a control unit (e.g., 202) and a drive unit (e.g., 204) control a charge switch to transfer power from an input terminal to an output terminal. By way of example, if a detect unit (e.g., 206) detects an enable signal (e.g., ES) at, e.g., logic high, the power transfer device (e.g., 200, 300 or 500) enters a charge mode, and a control unit (e.g., 202) and a drive unit (e.g., 204) are activated to control a charge switch (e.g., $S_{CHG}$, $S1_{CHG}$, ..., or $SN_{CHG}$). The charge switch is coupled between an input terminal (e.g., IN, IN1, ..., or INN) having an input voltage and an output terminal (e.g., OUT, OUT1, ..., or OUTN) having an output voltage of the power transfer device.

In step 604, during the charge mode, the drive unit drives the control unit to control the charge switch so as to adjust an output voltage (e.g., $V_{OUT}$) at the output terminal according to an input voltage (e.g., $V_{IN}$) at the input terminal and a reference voltage (e.g., $V_{REF}$) at a reference terminal (e.g., REF). In the FIG. 3 and FIG. 5 embodiments, the drive unit includes a charge pump (e.g., 310) and a switching unit (e.g., 312). The charge pump 310 provides a driving signal to drive a first amplifier (e.g., OTA1) in the control unit. The output of the first amplifier is provided to the charge switch to control the output voltage according to the input voltage and the reference voltage. The control unit includes a controller (e.g., the controller 308) that controls the reference voltage to increase, e.g., linearly, and adjusts the output voltage to follow the reference voltage to increase, e.g., linearly, during the charge mode.

In step 606, the control unit (e.g., 202) compares the reference voltage with the input voltage, and if a level of the reference voltage reaches a level of the input voltage, e.g., indicating a level of the output voltage has reached the level of the input voltage, the control unit can generate a control signal (e.g., the control signal CON in FIG. 3) to the switching unit.

In step 608, in response to the control signal (indicating the level of the reference voltage has reached the level of the input voltage), the control unit is deactivated to save power. In the FIG. 3 and FIG. 5 embodiments, the switching unit disconnects the first amplifier from the charge switch and connects the charge pump to control the charge switch in a state (e.g., operating in the linear region). The power transfer device enters a transfer mode.

In step 610, during the transfer mode, the control unit is deactivated. In the FIG. 3 and FIG. 5 embodiments, the charge pump maintains the level of the output voltage at or near the level of the input voltage. In addition, the charge pump can work at a relatively low frequency during the transfer mode to further save power.

Advantageously, compared with conventional methods for power transfer, the total power consumption is reduced in the embodiments according to the present invention. Specifically, in one embodiment, during the transfer mode, the control unit is deactivated/disabled to reduce power consumption. In the FIG. 3 and FIG. 5 embodiments, the charge pump can work at a relatively low frequency to further reduce the power consumption. Moreover, the output voltage provided to power the load can increase smoothly, e.g., linearly, during the charge mode, and can decrease smoothly, e.g., linearly, during the discharge mode, and variation rate of the output voltage can be adjusted to satisfy with different requirements.

In summary, in one embodiment, during a charge mode (which lasts for a start-up time), a control unit controls the reference voltage to increase, e.g., linearly, and a drive unit together with the control unit controls the charge switch so as to control the output voltage to increase, e.g., linearly, by following the reference voltage, until a level of the output voltage reaches a level of the input voltage. In one embodiment, during a discharge mode (which lasts for a shut-down time), the control unit turns on the discharge switch to decrease the output voltage, e.g., linearly. The start-up time and the shut-down time can be predetermined or adjusted according to different requirements of load devices. In one embodiment, during a transfer mode, the level of the output voltage is maintained at or near the level of the input voltage, and the charge switch is controlled, by the drive unit, in a state, e.g., operating in the linear region. The control unit is deactivated. As a result, the power transfer device consumes less power compared with conventional devices. Embodiments according to the present invention can be used in any kind of device which can be operable for powering components inside or outside of the device. The device can be, but is not limited to, a desktop, a laptop, a smart phone, a palmtop, or a tablet computer.

While the foregoing description and drawings represent embodiments of the present invention, it will be understood that various additions, modifications and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

What is claimed is:

1. A device comprising:
an input terminal configured to receive an input voltage;
an output terminal configured to provide an output voltage;
a control unit, coupled to said output terminal, configured to control a first switch that is coupled between said input and output terminals to adjust said output voltage according to said input voltage and a reference voltage, wherein said control unit is deactivated if a level of said reference voltage reaches a level of said input voltage; and
a drive unit, coupled to said control unit, configured to provide a connection between said control unit and said first switch if said control unit is activated, and configured to maintain a level of said output voltage at or near said level of said input voltage if said control unit is deactivated.

2. The device as claimed in claim 1, wherein if said control unit is activated, then said reference voltage and said output voltage increase.

3. The device as claimed in claim 1, further comprising a second switch, coupled to said control unit and said output terminal, configured to be controlled by said control unit to decrease said output voltage according to said reference voltage.

4. The device as claimed in claim 1, wherein said drive unit comprises a charge pump configured to maintain said first switch in a state to control said level of said output voltage at or near said level of said input voltage.

5. The device as claimed in claim 1, wherein said control unit varies said reference voltage and controls said output voltage to follow said reference voltage.

6. The device as claimed in claim 1, wherein said control unit adjusts said level of said output voltage according to a difference between said reference voltage and said output voltage.

7. The device as claimed in claim 1, wherein said device works in a mode selected from a charge mode, a discharge mode, and a transfer mode, and wherein said level of said output voltage increases during said charge mode, decreases during said discharge mode, and remains at or near said level of said input voltage during said transfer mode.

8. The device as claimed in claim 7, wherein said drive unit comprises:
   a charge pump configured to drive said control unit during said charge mode and said discharge mode, and configured to deactivate said control unit during said transfer mode; and
   a switching unit configured to provide an output of said control unit to control said first switch during said charge mode and to provide an output of said charge pump to control said first switch during said transfer mode.

9. The device as claimed in claim 7, wherein said control unit comprises:
   a controller configured to be activated during said charge mode to increase said reference voltage, deactivated during said transfer mode, and reactivated during said discharge mode to decrease said reference voltage; and
   a voltage follower, coupled between said controller and said output terminal, configured to increase said output voltage to follow said reference voltage during said charge mode and to decrease said output voltage to follow said reference voltage during said discharge mode.

10. A method comprising:
    transferring power from an input terminal to an output terminal via a first switch coupled between said input and output terminals, said input terminal having an input voltage, and said output terminal having an output voltage;
    controlling, using a control unit, said first switch to adjust said output voltage according to said input voltage and a reference voltage;
    deactivating said control unit if a level of said reference voltage reaches a level of said input voltage; and
    maintaining a level of said output voltage at or near said level of said input voltage if said control unit is deactivated.

11. The method as claimed in claim 10, further comprising increasing said reference voltage and said output voltage if said control unit is activated to control said first switch.

12. The method as claimed in claim 10, further comprising controlling a second switch, using said control unit, to decrease said output voltage according to said reference voltage.

13. The method as claimed in claim 10, further comprising:
    varying said reference voltage; and
    adjusting said output voltage to follow said reference voltage.

14. The power transfer method as claimed in claim 10, further comprising:
    adjusting said level of said output voltage according to a difference between said reference voltage and said output voltage.

15. A device comprising:
    a first switch, having a first terminal and a second terminal, configured to receive an input voltage at said first terminal to generate an output voltage at said second terminal, and configured to transfer power from said first terminal to said second terminal;
    a control unit, coupled to said first switch, configured to control said first switch to adjust said output voltage according to said input voltage and a reference voltage and to generate a control signal if a level of said reference voltage reaches a level of said input voltage, said control signal causing said control unit to be deactivated; and
    a drive unit, coupled between said control unit and said first switch, configured to provide a connection between said control unit and said first switch if said control unit is activated, and configured to maintain a level of said output voltage at or near said level of said input voltage if said control unit is deactivated.

16. The device as claimed in claim 15, wherein if said control unit is activated to control said first switch, then said reference voltage and said output voltage increase.

17. The device as claimed in claim 15, further comprising a second switch, coupled to said control unit and said output terminal, configured to be controlled by said control unit to decrease said output voltage according to said reference voltage.

18. The device as claimed in claim 15, wherein said power transfer device works in a mode selected from a charge mode, a discharge mode, and a transfer mode.

19. The device as claimed in claim 18, wherein said drive unit comprises:
    a charge pump configured to drive said control unit during said charge mode and said discharge mode, and configured to deactivate said control unit during said transfer mode, wherein said charge pump maintains said first switch in a state during said transfer mode; and
    a switching unit configured to provide an output of said control unit to control said first switch during said charge mode and to provide an output of said charge pump to control said first switch during said transfer mode.

20. The device as claimed in claim 18, wherein said control unit comprises:
    a controller configured to be activated during said charge mode to increase said reference voltage, to be deactivated during said transfer mode, and to be reactivated during said discharge mode to decrease said reference voltage; and
    a voltage follower, coupled between said controller and said output terminal, configured to increase said output voltage to follow said reference voltage during said charge mode and to decrease said output voltage to follow said reference voltage during said discharge mode.

* * * * *